United States Patent
Oh et al.

(10) Patent No.: US 6,784,100 B2
(45) Date of Patent: Aug. 31, 2004

(54) CAPACITOR WITH OXIDATION BARRIER LAYER AND METHOD FOR MANUFACTURING THE SAME

(75) Inventors: Hoon-Jung Oh, Ichon-shi (KR); Kyong-Min Kim, Ichon-shi (KR); Jong-Bum Park, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 9 days.

(21) Appl. No.: 10/318,100

(22) Filed: Dec. 13, 2002

(65) Prior Publication Data

US 2003/0235968 A1 Dec. 25, 2003

(30) Foreign Application Priority Data

Jun. 21, 2002 (KR) ......................................... 2002-35097

(51) Int. Cl.[7] .......................... H01L 21/41; H01L 29/76
(52) U.S. Cl. ...................... 438/660; 438/680; 438/778; 438/762; 438/769; 438/786; 438/787; 438/785; 257/309; 257/296; 257/303; 257/306; 257/310; 257/639; 257/640

(58) Field of Search ................................. 438/660, 404, 438/778, 762, 769, 785, 3, 240, 310, 389, 387, 680, 786, 787; 257/309, 296, 303, 306, 310, 639, 640

(56) References Cited

U.S. PATENT DOCUMENTS

| 6,365,486 B1 | 4/2002 | Agarwal et al. | |
| 6,548,368 B1 * | 4/2003 | Narwankar et al. | 438/398 |
| 2002/0009861 A1 * | 1/2002 | Narwankar et al. | 438/404 |
| 2003/0042526 A1 * | 3/2003 | Weiner | 257/309 |

* cited by examiner

*Primary Examiner*—Matthew Smith
*Assistant Examiner*—Igwe U. Anya

(57) ABSTRACT

This invention provides a capacitor and a method for manufacturing of the same, which are adaptable to preventing a lower electrode from being oxidized at a following thermal process. The capacitor includes: a lower electrode; an oxidation barrier layer formed on the lower electrode, wherein the oxidation barrier layer is formed of at least double nitridation layers; a dielectric layer formed on the oxidation barrier layer; and an upper electrode formed on the dielectric layer.

17 Claims, 8 Drawing Sheets

US 6,784,100 B2

CAPACITOR WITH OXIDATION BARRIER LAYER AND METHOD FOR MANUFACTURING THE SAME

FIELD OF THE INVENTION

The present invention relates to a method for manufacturing a semiconductor device and, more particularly, to a capacitor and a method for manufacturing of the same.

DESCRIPTION OF THE PRIOR ART

With higher integration of a semiconductor device such as DRAM, dielectric materials having a high dielectric constant are widely used in order to increase a capacitance. Generally, as the dielectric materials, metallic oxide materials such as $Ta_2O_5$, $TiO_2$, TaON, $HfO_2$, $Al_2O_3$, $ZrO_2$, etc., have been developed.

In high integrated devices of 256M or higher DRAM, a tantalum oxide ($Ta_2O_5$) layer used as the dielectric material of capacitors contained in a memory cell has a dielectric constant of about 25, which is 3 times to 4 times as high as a stack dielectric layer i.e., $Si_3N_4(=~7)/SiO_2(=~3.8)$ of a silicon oxide layer and a silicon nitride layer, which is typically used.

FIG. 1 is a cross-sectional diagram showing a schematic structure of a conventional cylinder-type MIS capacitor, in which a tantalum oxide layer as a dielectric layer is applied thereto.

Referring to FIG. 1, there is provided a semiconductor substrate 11 on which a transistor (not shown) and a bit line (not shown) are formed. An intermediate insulating layer 12 is formed on the semiconductor substrate 11. A storage node contact 13 passes through the intermediate insulating layer 12 and is connected to the semiconductor substrate 11. A cylinder-type lower electrode 14 formed of a polysilicon layer is connected to the storage node contact 13.

Then, a tantalum oxide layer 15 having a high dielectric constant is formed on the cylinder-type lower electrode 14, and an upper electrode 16 is formed on the tantalum oxide layer 15.

However, the MIS capacitor shown in FIG. 1 has several problems when it is applied to an actual capacitor structure.

For example, when following thermal processes are performed in order to secure a dielectric constant of the tantalum oxide ($Ta_2O_5$) layer, a low dielectric layer such as a silicon oxide layer is formed through an interfacial reaction between the lower electrode and the tantalum oxide layer, so that a total capacitance is remarkably lowered.

Typically, a following thermal process of the tantalum oxide ($Ta_2O_5$) layer is carried out through a plasma process of an oxygen atmosphere, a low-temperature thermal process of $UV-O_3$, a thermal process using a furnace, or a high-temperature thermal process of a rapid thermal process. In general, with an advance of the following process, the dielectric characteristic of the tantalum oxide ($Ta_2O_5$) layer itself may be improved. However, oxygen existing within the tantalum oxide layer or oxygen imported during following processes is diffused into the lower electrode to thereby oxidize the lower electrode. Consequently, the dielectric constant of the total dielectric layer will be reduced and the capacitance will be also decreased.

To prevent the oxidation of the lower electrode, an oxidation barrier layer is formed using a rapid thermal nitridation (RTN) of an $NH_3$ atmosphere, a surface nitridation method through a plasma process of an $NH_3$ atmosphere, or a deposition method of depositing a silicon nitride ($Si_3N_4$) layer.

FIG. 2 is a cross-sectional diagram explaining a manufacturing process of the oxidation barrier layer according to a conventional surface nitridation method.

Referring to FIG. 2, a lower electrode composed of a polysilicon layer 14 is formed, and then a nitridation layer 17a is formed on a surface of the polysilicon layer 14 using the nitridation method, such as the rapid thermal nitridation or the plasma process of the $NH_3$ atmosphere. At this time, the nitridation layer 17a formed by the nitridation of the surface of the polysilicon layer 14 is a silicon nitridation ($Si_xN_y$) layer and used as the oxidation barrier layer at the thermal process for securing the dielectric characteristic of a following tantalum oxide layer.

Then, a tantalum oxide layer 15 is deposited on the nitridation layer 17a, and a thermal process of an $O_2$ or $N_2O$ atmosphere is performed in order to crystallize the tantalum oxide layer 15 and reduce an impurity or an oxygen depletion.

However, the nitridation layer 17a which is formed using the surface nitridation method in order for an oxidation resistance is a layer formed by nitrifying only the surface of the polysilicon layer 14 acting as the lower electrode, and the lower electrode 14 is oxidized because the permeation of oxygen is not prevented sufficiently at the thermal process for securing the dielectric characteristic of the tantalum oxide layer 15.

FIG. 3 is a cross-sectional diagram showing a problem caused when the nitride layer for the oxidation resistance is formed on the lower electrode according to the conventional deposition method, in which a silicon nitride layer is unevenly formed along a lower layer.

Referring to FIG. 3, a storage node contact 13 is formed within an intermediate insulating layer 12 and connected to a semiconductor substrate (not shown). A lower electrode composed of a polysilicon layer 14 is formed on the storage node contact 13. Sequentially, a silicon nitride layer 17b is deposited on the polysilicon layer 14 using the deposition method. Thereafter, a tantalum oxide layer 15 is deposited on the silicon nitride layer 17b and a thermal process of an $O_2$, $O_3$ or $N_2O$ atmosphere is performed in order to secure the dielectric characteristic of the tantalum oxide layer 15.

Here, the silicon nitride layer 17b acting as the oxidation barrier layer formed according to the deposition method must have a thickness of 50 Å or less in order to secure the dielectric characteristic thereof.

However, since the lower layers exposed prior to the deposition of the silicon nitride layer 17b is different from each other, there occurs a problem that the silicon nitride layer is unevenly deposited.

In other words, as shown in FIG. 3, the cylinder-type lower electrode is connected to the storage node contact 13 passing through the intermediate insulating layer 12. At this time, when the cylinder-type lower electrode is formed of the polysilicon layer 14 and the silicon nitridation layer 17b is deposited on the polysilicon layer 14, the neighbor intermediate insulating layer 12 as well as the polysilicon layer 14 is exposed prior to the deposition of the silicon nitride layer 17b includes.

Accordingly, respective incubation times in the polysilicon layer 14 and, the intermediate insulating layer 12 are different from each other. In other words, a deposition rate of the silicon nitride layer 17b is different along the lower layer. As a result, although the silicon nitridation layer 17b is deposited on the polysilicon layer 14 to a desired thickness, it is deposited on the intermediate insulating layer 12 to a thin thickness. Therefore, the oxygen is permeated through the interface between the silicon nitride layer 17b of a thin thickness and the intermediate insulating layer 12 at the following thermal process, so that the polysilicon layer 14 is oxidized.

Further, an generation and increase of the leakage current of the capacitor will be caused due to the uneven-thickness characteristic of the silicon nitride layer 17b.

SUMMARY OF THE INVENTION

It is, therefore, an object of the present invention to provide a capacitor which is adaptable for preventing a lower electrode from being oxidized at a following thermal process and a method for manufacturing of the same.

To accomplish the above object, there is provided a capacitor which includes: a lower electrode; an oxide barrier layer formed on the lower electrode, wherein the oxide barrier layer is formed of at least double nitridation layers; a dielectric layer formed on the oxide barrier layer; and an upper electrode formed on the dielectric layer.

Further, to accomplish the above object, there is provided a method for manufacturing a capacitor, in which the method includes the steps of: a) forming a lower electrode; b) forming a first nitridation layer on the lower electrode; c) forming a second nitride layer on the first nitridation layer; d) forming a dielectric layer on the second nitridation layer; e) performing a thermal process so as to secure a dielectric characteristic of the dielectric layer; and f) forming an upper electrode on the dielectric layer.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Figure 1:
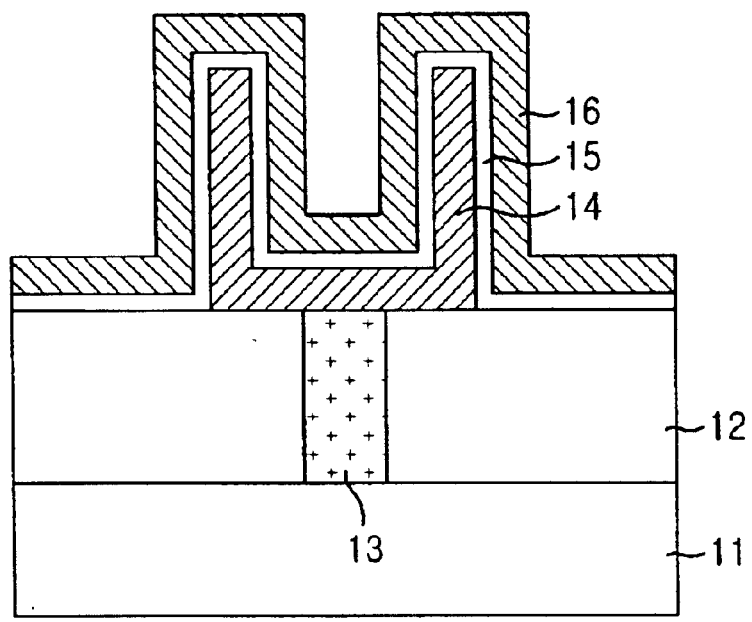
FIG. 1 is a cross-sectional diagram showing a schematic structure of a conventional cylinder-type MIS capacitor.
Figure 2:
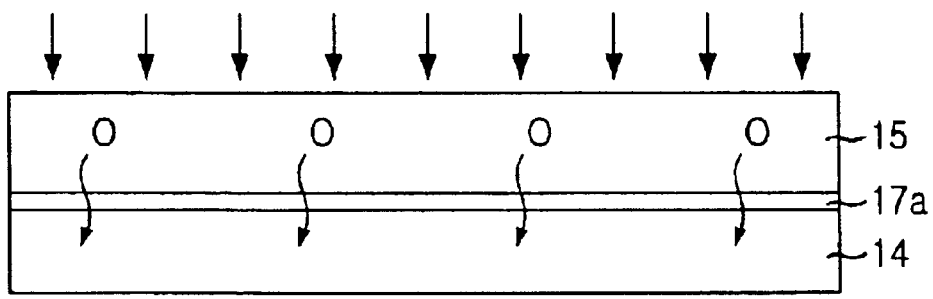
FIG. 2 is a cross-sectional diagram explaining a method for fabricating an oxide barrier layer using a conventional nitridation method.
Figure 3:
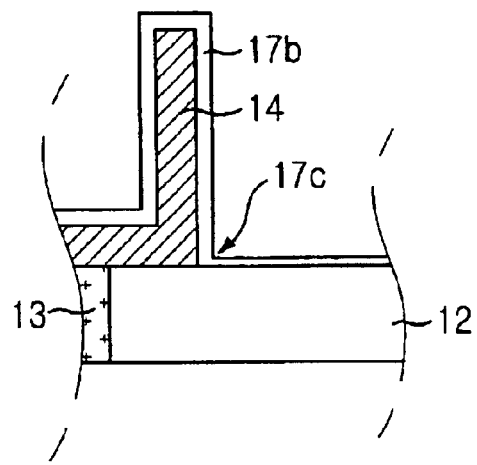
FIG. 3 is a cross-sectional diagram showing an uneven deposition characteristic of a conventional silicon nitridation layer.
Figure 4:
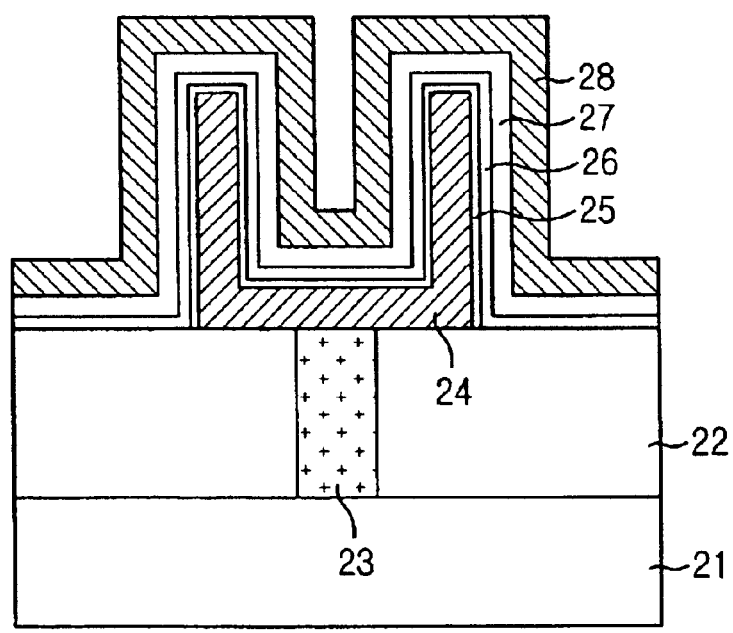
FIG. 4 is a cross-sectional diagram illustrating a schematic structure of an MIS capacitor of a semiconductor device in accordance with a first embodiment of the present invention.
Figure 5:
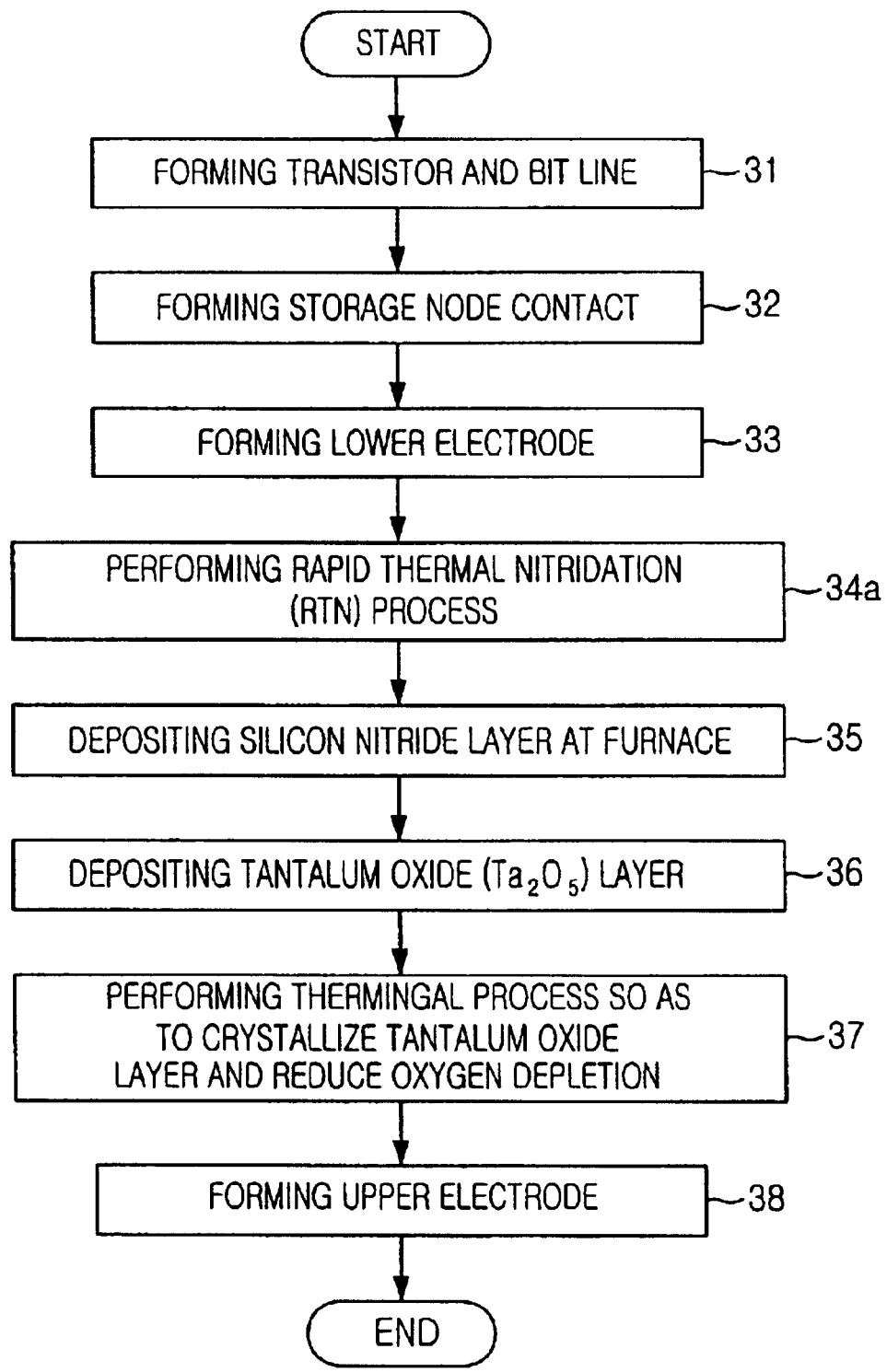
FIG. 5 is a flowchart explaining a manufacturing method of an MIS capacitor of a semiconductor device in accordance with a second embodiment of the present invention.

FIG. 4 is a cross-sectional diagram illustrating an MIS capacitor in accordance with a first embodiment of the present invention, and FIG. 5 is a flowchart explaining a manufacturing method of the MIS capacitor shown in FIG. 4 according to a second embodiment of the present invention.

Referring to FIG. 4, there is provided a semiconductor substrate 21 on which a transistor (not shown) and a bit line (not shown) are formed. An intermediate insulating layer 22 is formed on the semiconductor substrate 21. A storage node contact 23 passes through the intermediate insulating layer 22 and is connected to the semiconductor substrate 21. A cylinder-type lower electrode 24 formed of a polysilicon layer is connected to the storage node contact 23.

Then, an oxidation barrier layer, which is composed of a first silicon nitridation layer 25 and a second silicon nitride layer 26, is formed on the polysilicon layer 24. A tantalum oxide layer 27 is formed on the second silicon nitride layer 26 and then an upper electrode 28 is formed on the tantalum oxide layer 27. The upper electrode 28 is formed of a titanium nitride layer or a stack layer of a titanium nitride layer/polysilicon layer.

FIG. 5 illustrates a manufacturing method of the MIS capacitor in accordance with the second embodiment of the present invention. Referring to FIG. 5, the manufacturing method of the MIS capacitor includes the steps of: forming a transistor and a bit line 31; forming a storage node contact 32; forming a lower electrode composed of a polysilicon layer 33; performing a rapid thermal nitridation process 34a; depositing a silicon nitride layer at a furnace 35; depositing a tantalum oxide layer 36; performing a thermal process in order to crystallize the tantalum oxide layer and reduce an impurity and an oxygen depletion 37; and forming an upper electrode 38.

Hereinafter, the manufacturing method of the MIS capacitor will be described in detail with reference to FIGS. 4 and 5. To begin with, the transistor and the bit line are formed on the semiconductor substrate using a known method.

The step 32 of forming the storage node contact is carried out in a following manner. First, the intermediate insulating layer 22 is formed on the semiconductor substrate 21 on which the transistor and the bit line are formed, and then the storage node contact 23 passing through the intermediate insulating layer 22 and connected to the semiconductor substrate 21 is formed. Here, the storage node contact 23 can be a stack layer of a polysilicon plug, a titanium silicide (TiSi$_2$) layer and a titanium nitride (TiN) layer.

Then, the step 33 of forming the cylinder-type lower electrode is carried out. For example, after a sacrificial layer to determine a height of the lower electrode is deposited on the intermediate insulating layer on which the storage node contact 23 is formed, the sacrificial layer is etched to thereby form a concave in which the lower electrode is to be formed. The polysilicon layer 24 is deposited on the sacrifice layer having the concave. Then, an etch back process or a chemical mechanical polishing (CMP) is performed on the polysilicon layer 24, thereby remaining the polysilicon layer 24 only within the concave. Thereafter, the sacrifice is removed to thereby form the cylinder-type lower electrode composed of the polysilicon layer 24.

Next, a surface of the polysilicon layer 24 formed in the above-described manner is cleaned using HF or HF/NH$_4$OH.

Then, the step 34a of performing the rapid thermal nitridation is carried out. The rapid thermal nitridation is a process for forming the oxidation barrier layer so as to prevent the polysilicon layer 24 (i.e., the lower electrode) from being oxidized due to the following high-temperature thermal process of the oxygen atmosphere. The rapid thermal nitridation (RTN) of the NH$_3$ atmosphere is performed to nitrify the surface of the polysilicon layer 24, thereby forming the first silicon nitridation layer 25.

At this time, the rapid thermal nitridation (RTN) of the NH$_3$ atmosphere is performed for 60 seconds to 180 seconds under the conditions that a temperature is 500° C. to 850° C., a flow rate of NH$_3$ is 1 sccm to 20 sccm and a high pressure is maintained.

Then, the step 35 of depositing the second silicon nitridation layer 26 is carried out. The deposition process of the silicon nitride layer is also the step of forming the oxidation barrier layer and the second silicon nitride layer 26 is deposited in the furnace.

The second nitride layer 26 is deposited using a source gas containing NH$_3$ and SiH$_2$Cl$_2$ or a source gas containing NH$_3$ and SiH$_4$ for 3 minutes to 60 minutes in the furnace, in which the furnace maintains a temperature of 500° C. to 850° C. and a pressure of 0.05 torr to 1 torr.

Then, the step 36 of depositing the tantalum oxide layer 27 is carried out. First, the tantalum oxide layer 27 is deposited on the second silicon nitride layer 26 using a chemical vapor deposition (CVD). For example, a tantalum ethylate [Ta(OC$_2$H$_5$)$_5$] as a source material within a reaction chamber flows through a carrier gas (N$_2$). At this time, a flow rate of N$_2$ is 350 sccm to 450 sccm. After an oxygen as a reaction gas (or oxidant) within the reaction chamber flows at a flow rate of 10 sccm to 1000 sccm, the tantalum ethylate provided on the semiconductor substrate heated to 200° C. to 500° C. is pyrolyzed and the tantalum oxide layer 27 is deposited. At this time, a pressure of the reaction chamber is 0.2 torr to 10 torr. Meanwhile, the tantalum ethylate widely used as a source for forming the tantalum oxide layer 27 is a liquid state at a room temperature and is evaporated at a temperature of 145° C. Therefore, in order to easily react the tantalum ethylate, the source of the liquid state must be changed into that of the gaseous state. In other words, after changing the tantalum ethylate into the gaseous state in an evaporator that maintains a temperature of 170° C. to 190° C., it is carried on the nitrogen gas and supplied into the reaction chamber.

Then, the step 37 of performing the thermal process is carried out in order to crystallize the tantalum oxide layer and reduce an impurity and an oxygen depletion. Here, the thermal process is performed at an N$_2$O or O$_2$ atmosphere and at a temperature of 600° C. to 900° C. so as to crystallize the tantalum oxide layer 27, remove an impurity such carbon and compensate for the oxygen depletion.

Then, the step 38 of forming the upper electrode is carried out. The titanium nitride (TiN) layer 28 or the stack layer of polysilicon/TiN layer are deposited on the tantalum oxide layer 27 on which the thermal process is previously performed, thereby completing the formation of the MIS capacitor.

Figure 6:
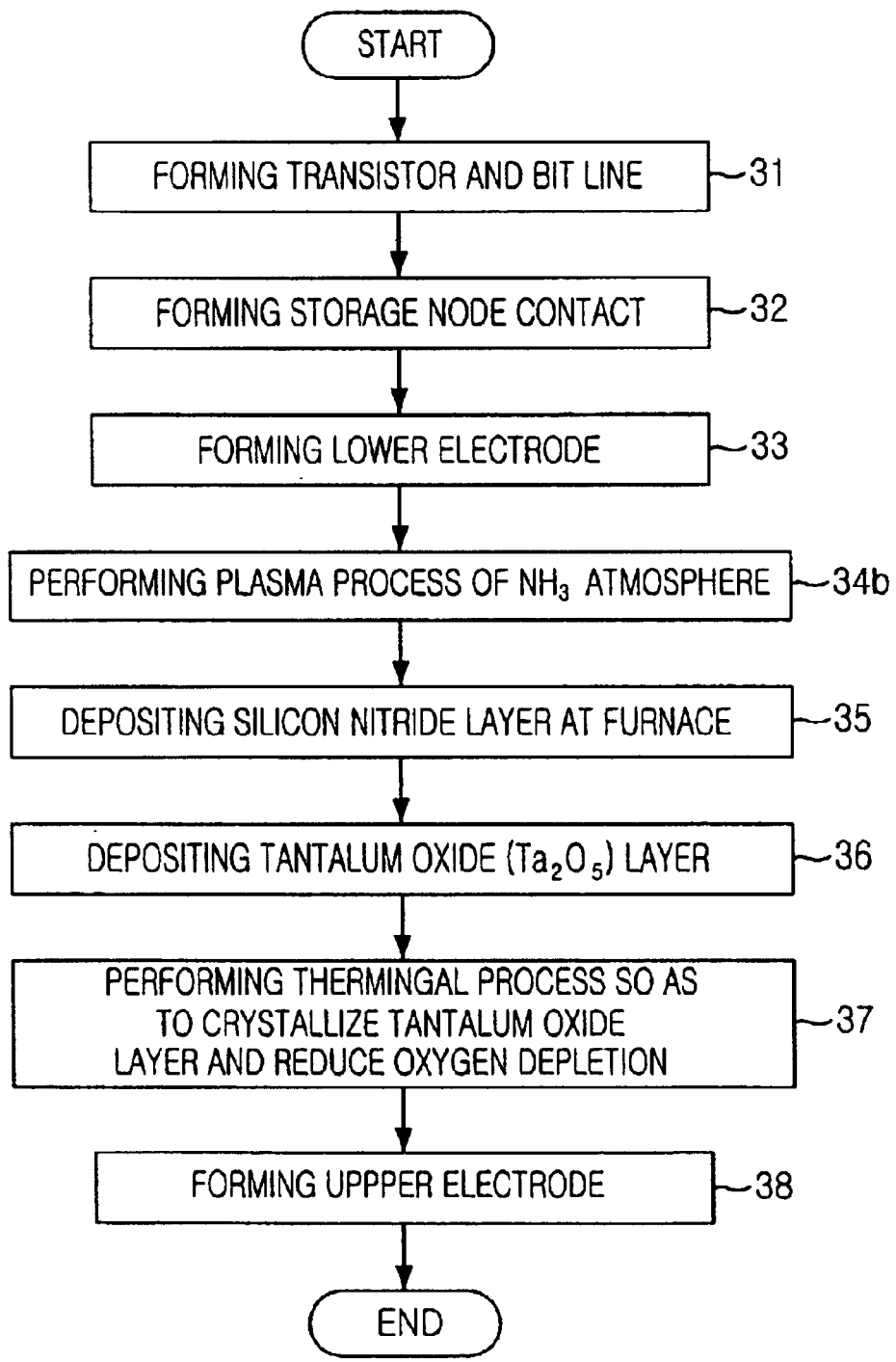
FIG. 6 is a flowchart explaining a manufacturing method of an MIS capacitor of a semiconductor device in accordance with a third embodiment of the present invention.

FIG. 6 illustrates a manufacturing method of the MIS capacitor in accordance with a third embodiment of the present invention.

Referring to FIGS. 4 and 6, the step 31 of forming the transistor and the bit line, the step 32 of forming the storage node contact (32) and the step 33 of forming the lower electrode (33) are sequentially carried out according to the above-described process.

Next, the surface of the polysilicon layer 24 formed by the above-described process is cleaned using HF or HF/NH$_4$OH.

Then, the step 34b of performing the plasma process is carried out. The plasma process of the NH$_3$ atmosphere is a process for forming the oxidation barrier layer so as to prevent the polysilicon layer 24 (i.e., the lower electrode) from being oxidized due to the following high-temperature thermal process of the oxygen atmosphere. The plasma process of the NH$_3$ atmosphere is performed to nitrify the surface of the polysilicon layer 24, thereby forming the first silicon nitridation layer 25.

At this time, the plasma process of the NH$_3$ atmosphere is performed for 30 seconds to 300 seconds under the conditions that a flow rate of NH$_3$ is 10 sccm to 1000 sccm, an RF power for generating the plasma is 50 W to 400 W, and a pressure is 0.1 torr to 2 torr.

Then, the step 35 of depositing the silicon nitride layer 26, the step 37 of depositing the tantalum oxide layer 27 and the step 38 of forming the upper electrode are sequentially carried out according to the above-described process, thereby completing the formation of the MIS capacitor.

According to the first, second and third embodiments of the present invention, at the following thermal process, it is possible to prevent the oxygen from being permeated into the polysilicon layer 24 by inserting the double layers acting as the oxidation barrier layer, which are composed of the first silicon nitridation layer 25 and the second silicon nitride 26, between the polysilicon layer 24 (i.e., the lower electrode) and the tantalum oxide layer 27. At this time, the first silicon nitridation layer 25 is formed using the surface nitridation method and the second silicon nitride layer 26 is formed using the deposition method.

Meanwhile, although it is described that the above embodiments utilizes the rapid thermal nitridation or the plasma process of the NH$_3$ atmosphere as the surface nitridation method for forming the first silicon nitridation layer 25, it is also possible to form the first silicon nitridation layer 25 by performing the thermal process in the furnace. At this time, the furnace maintains a temperature of 500° C. to 850° C., a pressure of 10 torr to 100 torr, and a thermal processing time of 30 minutes to 180 minutes. This is called EFN(Effective Furnace Nitridation) process. An EFN layer is composed of a silicon nitridation layer, a silicon oxynitride layer and a silicon nitride layer stacked in this order.

Figure 7A:
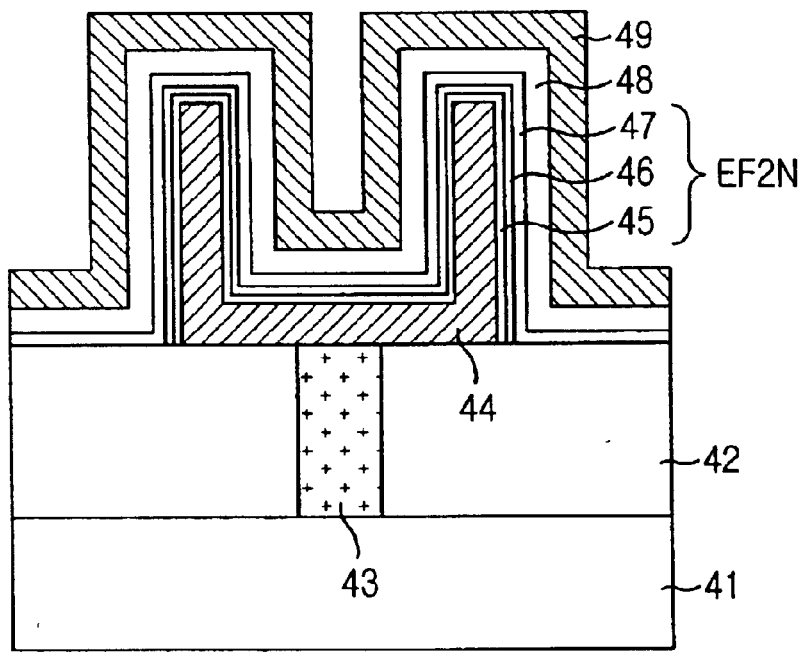
FIG. 7A is a cross-sectional diagram illustrating a schematic structure of an MIS capacitor of a semiconductor device in accordance with a fourth embodiment of the present invention.
Figure 7B:
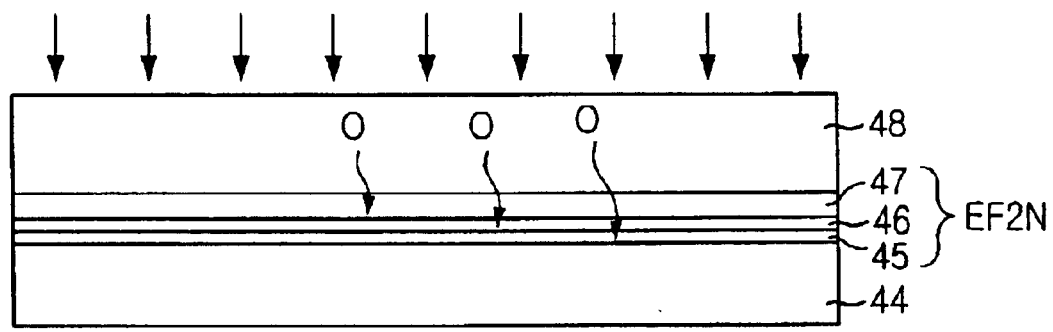
FIG. 7B is a cross-sectional diagram illustrating a prevention of oxygen permeation into the capacitor shown in FIG. 7A.

FIG. 7A is a cross-sectional diagram illustrating a schematic structure of the MIS capacitor in accordance with a fourth embodiment of the present invention, and FIG. 7B is a cross-sectional diagram illustrating a prevention of oxygen permeation into the capacitor shown in FIG. 7A.

Referring to FIG. 7A, there is provided a semiconductor substrate 41 on which a transistor and a bit line are formed. An intermediate insulating layer 42 is formed on the semiconductor substrate 41. A storage node contact 43 passes through the intermediate insulating layer 42 and is connected to the semiconductor substrate 41. A cylinder-type lower electrode formed of a polysilicon layer 44 is connected to the storage node contact 43.

Then, an enhanced furnace double nitridation (EF2N) layer, which is composed of a first silicon nitridation layer 45, a silicon oxynitride layer 46 and a second silicon nitride layer 47, is formed on the polysilicon layer 44. The first silicon nitridation layer 45 is formed by performing the thermal process of $NH_3$ atmosphere in the furnace and nitrifying a surface of the polysilicon layer 44. The silicon oxynitride layer 46 is a native oxide layer of the first silicon nitridation layer 45 and the second silicon nitride layer 47 is deposited in a low pressure chemical vapor deposition (LPCVD) apparatus.

Then, a tantalum oxide layer 48 and an upper electrode 49 are sequentially formed on the EF2N layer. The upper electrode 49 is a titanium nitride layer, or a stack structure of a titanium nitride layer and a polysilicon layer.

As shown in FIGS. 7A and 7B, in the MIS capacitor of the semiconductor device in accordance with the present invention, the EF2N layer acting as the oxidation barrier layer, which are composed of the first silicon nitridation layer 45, the silicon oxynitride layer 46 and the second silicon nitride 46, is inserted between the polysilicon layer 44 (i.e., the lower electrode) and the tantalum oxide layer 48.

Accordingly, the oxidation barrier layer composed of the triple layers (i.e., EF2N) can prevent the oxygen from being permeated into the lower electrode at the thermal process for crystallizing a following tantalum oxide layer and securing the dielectric characteristic by reducing an impurity and an oxygen depletion.

Figure 8:
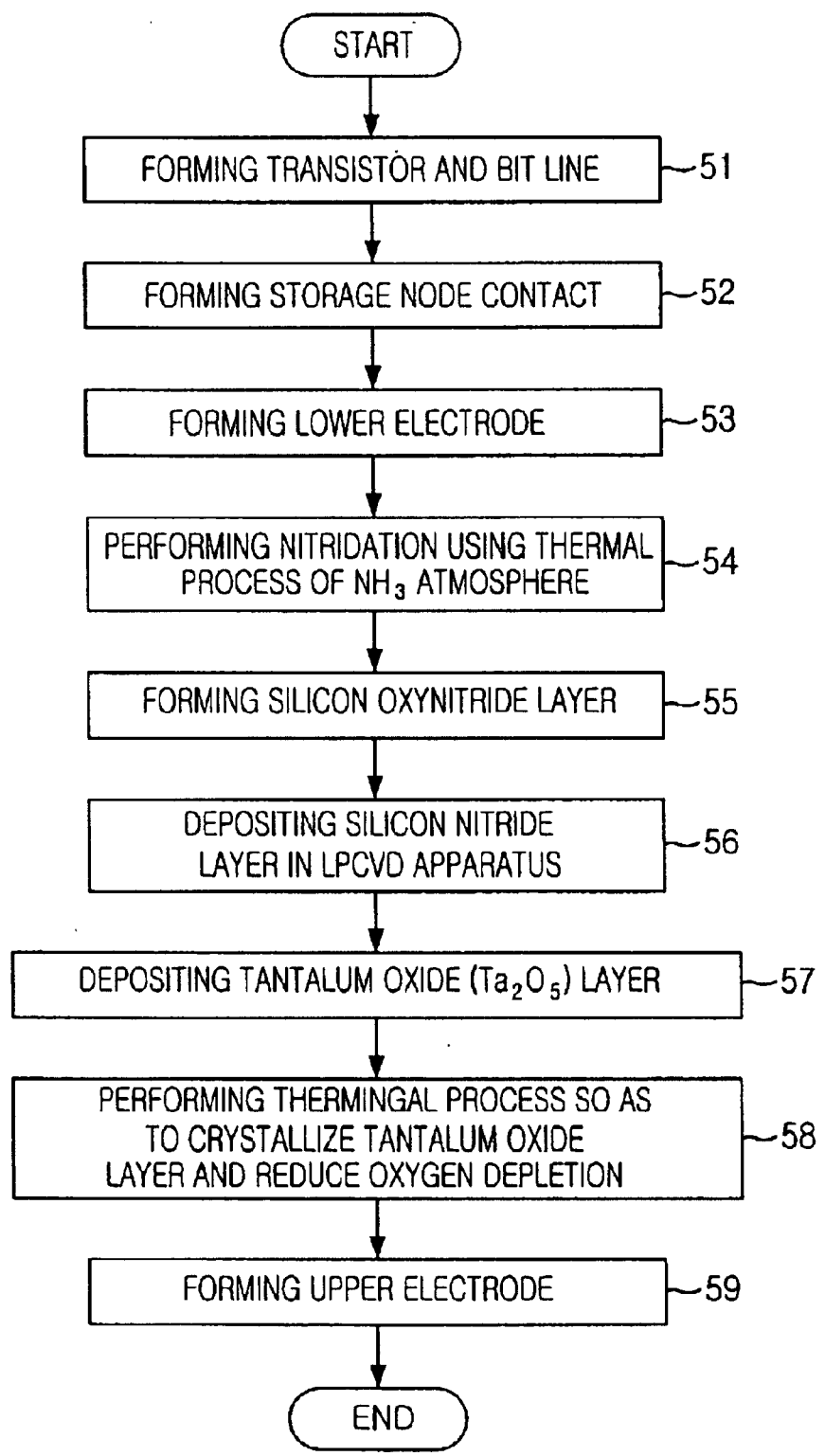
FIG. 8 is a flowchart explaining a manufacturing method of an MIS capacitor of a semiconductor device in accordance with a fifth embodiment of the present invention.

FIG. 8 illustrates a manufacturing method of the MIS capacitor in accordance with a fifth embodiment of the present invention. Referring to FIG. 8, the manufacturing method of the MIS capacitor includes the steps of: forming a transistor and a bit line (51); forming a storage node contact (52); forming a lower electrode composed of a polysilicon layer (53); performing a nitridation using a furnace thermal process of an $NH_3$ atmosphere (54); forming a silicon oxynitride layer (55); forming a silicon nitride layer at a LPCVD apparatus (56); depositing a tantalum oxide layer (57); performing a thermal process in order to crystallize the tantalum oxide layer and reduce an impurity and an oxygen depletion (58); and forming an upper electrode (59). The silicon oxynitride layer is formed when the substrate is unloaded from the furnace in which the nitridation process is performed.

Hereinafter, the manufacturing method of the MIS capacitor will be described in detail with reference to FIGS. 8 and 7a. To begin with, the transistor and the bit line are formed on the semiconductor substrate using a known method.

The step 52 of forming the storage node contact is carried out in a following manner. First, the intermediate insulating layer 42 is formed on the semiconductor substrate 41 on which the transistor and the bit line are formed, and then the storage node contact 43 passing through the intermediate insulating layer 42 and connected to the semiconductor substrate 41 is formed. Here, the storage node contact 43 can be a stack layer of a polysilicon plug, a titanium silicide ($TiSi_2$) layer and a titanium nitride (TiN) layer.

Then, the step 53 of forming the cylinder-type lower electrode is carried out. For example, after a sacrificial layer to determine a height of the lower electrode is deposited on the intermediate insulating layer 42 on which the storage node contact 43 is formed, the sacrificial layer is etched to thereby form a concave in which the lower electrode is to be formed. The polysilicon layer 44 is deposited on the sacrificial layer having the concave.

Then, an etch-back process or a chemical mechanical polishing (CMP) is performed on the polysilicon layer 44, thereby remaining the polysilicon layer 44 only within the concave. Thereafter, the sacrifice is removed to thereby form the cylinder-type lower electrode composed of the polysilicon layer 44.

Then, the step 54 of performing the nitridation process using the furnace thermal process of the $NH_3$ atmosphere is carried out. In step 54, the oxidation barrier layer is formed so as to prevent the polysilicon layer 44 (i.e., the lower layer) from being oxidized due to the following high-temperature thermal process. After loading the semiconductor substrate 41 on which the polysilicon layer 44 is formed into the furnace, the thermal process of the $NH_3$ atmosphere is performed to nitrify the surface of the polysilicon layer 44. At this time, the thermal process is performed for 30 minutes to 180 minutes under the conditions that a temperature is 500° C. to 850° C. and a pressure is 10 torr to 100 torr. As described above, the first silicon nitridation layer 45 is formed on the surface of the polysilicon layer 44 using the thermal process of the $NH_3$ atmosphere in the furnace. The thermal process is performed until the first silicon nitridation layer 45 is formed to a thickness of 3 Å to 5 Å. The thickness of the first silicon nitridation layer 45 can be measured as silicon nitride($Si_3N_4$) layer by using an ellipsometer as one of thickness measurement methods.

Then, after unloading the semiconductor substrate 41 out of the furnace, the semiconductor substrate 41 is exposed to air to thereby form the native oxide layer such as the silicon oxynitride ($SiO_xN_y$) layer 46 on the first silicon nitridation layer 45.

Then, the step 56 of depositing the silicon nitride layer in the LPCVD apparatus is carried out. The semiconductor substrate 41 on which the silicon oxynitride layer 46 is formed is loaded into a chamber of the LPCVD apparatus and then the second silicon nitride layer 47 is deposited on the silicon oxynitride layer 46.

At this time, the deposition of the second silicon nitride layer 47 is performed using a source gas containing $NH_3$ and $SiH_2Cl_2$ or a source gas containing $NH_3$ and $SiH_4$ at a temperature of 500° C. to 850° C. and a pressure of 0.05 torr to 1 torr.

If the second silicon nitride layer 47 is deposited in the LPCVD apparatus, the first silicon nitridation layer 45, the silicon oxynitride layer 46 and the second silicon nitridation layer 47 are formed to 5 Å to 50 Å thick in total.

Meanwhile, the second silicon nitride layer 47 is deposited on the silicon oxynitride layer 46 which is the same oxide material and the intermediate insulating layer 42, thereby securing the uniformity of thickness.

The EF2N process is provided with the step 54 of performing the nitridation using the furnace thermal process of the $NH_3$ atmosphere as the surface nitridation method, the step 55 of forming the silicon oxynitride layer, and the step 56 of depositing the silicon nitride layer in the LPCVD apparatus. The first silicon nitridation layer 45, the silicon oxynitride layer 46 and the second silicon nitride 47, which are formed through the EF2N process, are called EF2N layers.

Then, the step 57 of depositing the tantalum oxide layer is carried out. First, the tantalum oxide layer 48 is deposited on the second silicon nitride layer 47. At this time, the tantalum oxide layer. 48 is deposited to a thickness of 20 Å to 150 Å. As an example, the deposition process of the tantalum oxide layer 48 using the CVD method will be described. The tantalum ethylate [$Ta(OC_2H_5)_5$] as a source material flows through a carrier gas ($N_2$) within a reaction chamber. At this time, a flow rate of $N_2$ is 350 sccm to 450 sccm. After an oxygen as a reaction gas (or an oxidant) flows within the reaction chamber at a flow rate of 10 sccm to 1000 sccm, the tantalum ethylate provided on the semiconductor substrate heated to 200° C. to 500° C. is pyrolyzed and the tantalum oxide layer 48 is deposited. At this time, a pressure of the reaction chamber is 0.2 torr to 10 torr.

Meanwhile, the tantalum ethylate widely used as a source for forming the tantalum oxide layer 48 is a liquid state at a room temperature and is evaporated at a temperature of 145° C. Therefore, in order to easily react the tantalum ethylate, the source of the liquid state must be changed into that of the gaseous state. In other words, after changing the tantalum ethylate into the gaseous state in an evaporator that maintains a temperature of 170° C. to 190° C., it is carried on the nitrogen gas and supplied into the reaction chamber.

Then, the step 58 of performing the thermal process is carried out in order to crystallize the tantalum oxide layer and reduce an impurity and an oxygen depletion. Here, when the thermal process is performed at the oxygen atmosphere, $N_2O$ or $O_2$ are used as an oxygen supply gas, and the rapid thermal oxidation method or the furnace method are used at the high temperature of 600° C. to 900° C.

Then, the step 59 of forming the upper electrode is carried out. The titanium nitride (TiN) layer or the stack layer of polysilicon/TiN layer is deposited on the tantalum oxide layer 48, thereby completing the formation of the MIS capacitor.

According to the second embodiment of the present invention, it is possible to twofold prevent the permeation of oxygen into the polysilicon layer 44 in the following thermal process of the oxygen atmosphere by forming the oxidation barrier layer composed of the first silicon nitridation layer 45 and the second silicon nitride layer between the lower electrode (i.e., the polysilicon layer 44) and the tantalum oxide layer 48.

Further, since the silicon oxynitride ($SiO_xN_y$) layer 46 inserted between the first silicon nitridation layer 45 and the second silicon nitride layer 47 has a high oxygen concentration, it can also acts as the oxidation barrier layer, thereby trebly preventing the oxidation of the polysilicon layer 44 (i.e., the lower electrode).

Furthermore, an interfacial layer between the polysilicon layer 44 and the tantalum oxide layer 48 becomes a silicon nitride ($Si_3N_4$) rich layer with a dielectric constant ( ) of about 7, so that a total capacitance is increased.

Although the second embodiment of the present invention utilizes the furnace thermal process at the step of forming the first nitridation layer, it can be also applicable to other surface nitridation method such as the rapid thermal nitridation method or the plasma process.

For example, the rapid thermal nitridation process is carried out for 60 seconds to 180 seconds under the conditions that a temperature is 500° C. to 850° C., a flow rate of $NH_3$ is 1 slm to 20 slm, and a pressure is high.

Further, the first nitridation layer is formed through the plasma process of the $NH_3$ atmosphere. At this time, the plasma process is carried out for 30 minutes to 300 minutes under the conditions that a flow rate of $NH_3$ is 10 sccm to 1000 sccm, an RF power for generating the plasma is 50 W to 400 W, and a pressure is 0.1 torr to 2 torr.

A TABLE 1 shows the processing conditions according to a comparison of the present invention with the prior art, in which the tantalum oxide layers is deposited to a thickness of 80 Å in both the present invention and the prior art and the following thermal process is carried out for 5 minutes at a temperature of 800° C. While, the oxidation barrier layer of the prior art is formed through the plasma process of the $NH_3$ atmosphere, the oxidation barrier layer of the present invention is formed through the EF2N method.

TABLE 1

|  | THE PRIOR ART | THE PRESENT INVENTION |
|---|---|---|
| NITRIDATION | $NH_3$ PLASMA | EF2N |
| THICKNESS OF TANTALUM OXIDE LAYER | 80 Å | 80 Å |
| $N_2O$ THERMAL PROCESS | 800° C., 5 MINUTES | |

Figure 9:
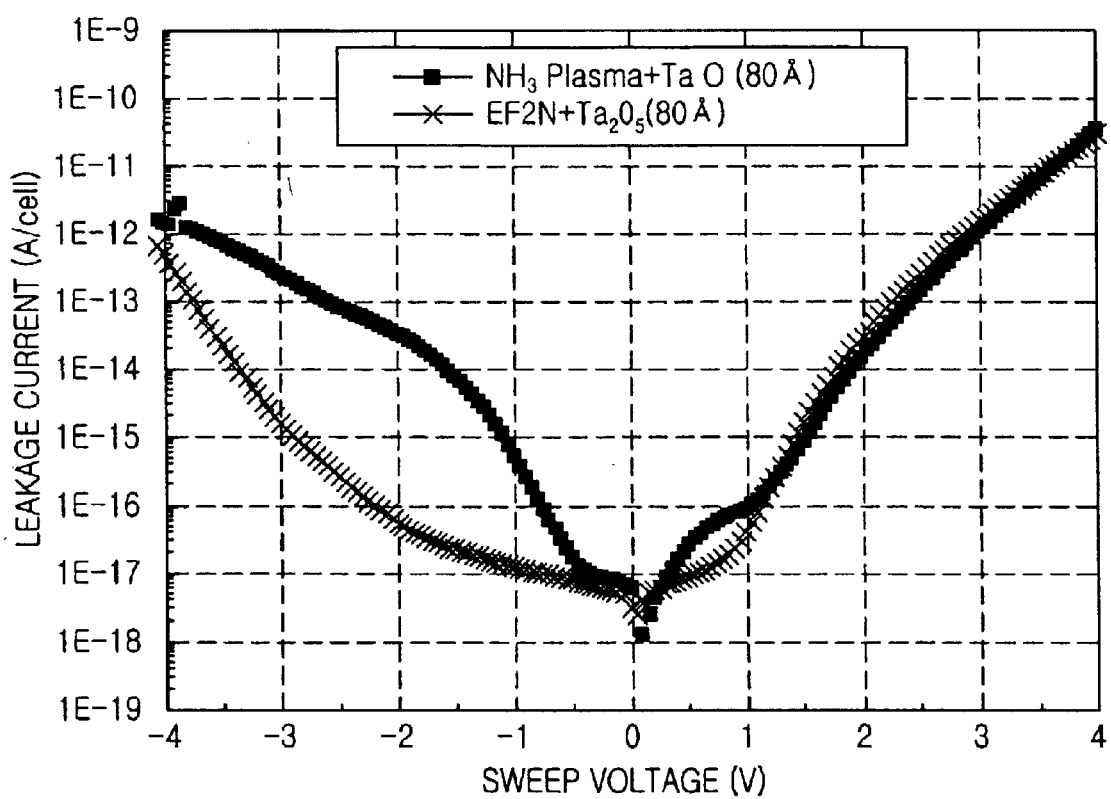
FIG. 9 is a graph of a leakage current characteristic according to a comparison of the present invention with the prior art.

FIG. 9 is a graph of a leakage current characteristic according to a comparison of the present invention with the prior art. In FIG. 9, an x-axis and an y-axis denote a sweep voltage (V) and a leakage current (A/cell), respectively.

Referring to FIG. 9, in case where the sweep voltage is positive, the leakage current characteristic of the prior art is similar to that of the present invention. On the contrary, in case where the sweep voltage is negative, the leakage current of the present invention in which the EF2N layer is used as the oxidation barrier is remarkably reduced compared with that of the prior art in which only the nitridation layer formed through the $NH_3$ plasma process is used as the oxidation barrier layer.

A TABLE 2 shows an electrical characteristic according to a comparison of the present invention with the prior art.

TABLE 2

|  | THE PRESENT INVENTION | THE PRIOR ART |
|---|---|---|
| Cs (fF/cell) @ 1.0 V | 9.02 | 10.2 |
| Cs (fF/cell) @ −1.0 V | 8.67 | 9.65 |
| L.C (fA/cell) @ 1.0 V | 0.015 | 0.020 |
| L.C (fA/cell) @ −1.0 V | 0.057 | 0.007 |
| B.L (V) @ 1 pA | 3.2 | 3.0 |
| B.V (V) @ −1 pA | 4.5 | 4.2 |
| Cs (%) increment (on the basis of the prior art) | — | 11.30% |

Referring to the TABLE 2, there is shown the capacitance and leakage current per cell in case where the sweep voltage is 1.0 V and −1.0 V, respectively. Compared with the prior art, the present invention has larger capacitance per cell (Cs) and remarkably reduced leakage current. Further, the breakdown voltage (B.V) of the present invention is smaller compared with the prior art but it's acceptable in DRAM device operation.

As described above, referring to FIG. 9 and the TABLE 2, the present invention has an improved electrical characteristic compared with the prior art.

Figure 10:
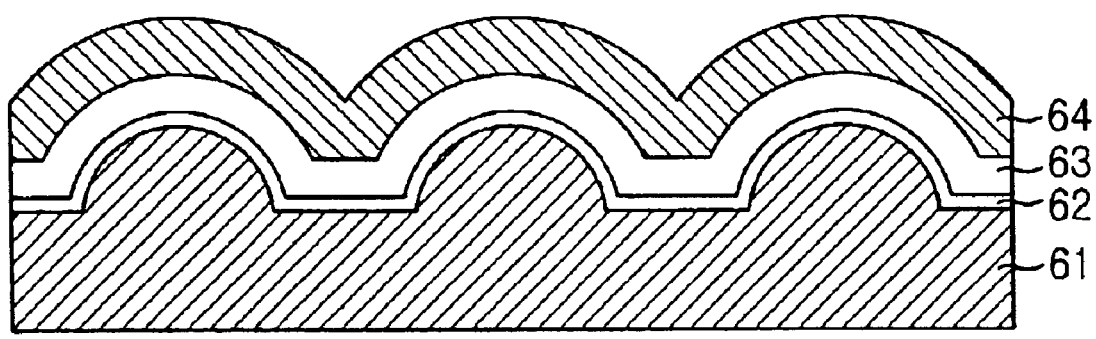
FIG. 10 is a cross-sectional diagram illustrating a structure of a lower electrode of an MIS capacitor in accordance with a sixth embodiment of the present invention.

FIG. 10 illustrates an MIS capacitor in accordance with a third embodiment of the present invention.

Referring to FIG. 10, a lower structure of the capacitor is identical to that of the first and second embodiments. An EF2N layer 62 as the oxidation barrier layer is formed on a polysilicon layer 61 having unevenness such as Hemi-Spherical Grain (HSG) formed on a surface thereof. A tantalum oxide layer 63 is formed on the EF2N layer 62, and an upper electrode 64 composed of the titanium nitride layer is formed on the tantalum oxide layer 63.

As a result, in the sixth embodiment of the present invention, the permeation of oxygen is prevented in the following thermal process by inserting the EF2N layer 62 between the polysilicon layer 61 and the tantalum oxide layer 63, thereby preventing the polysilicon layer 61 from being oxidized.

In addition to the MIS capacitor, the present invention is applicable to a metal insulator metal (MIM) capacitor, a semiconductor insulator semiconductor(SIS) capacitor, a cylinder-type capacitor and a concave-type capacitor. For example, in case where a metal layer is used as the lower electrode, the oxidation barrier layer can be a double layer composed of nitridation layers instead of the silicon nitridation layer, or a triple layer composed of the nitridation layer, the oxynitride layer and the nitridation layer.

Although the tantalum oxide layer is described as an example of the dielectric layer, it is also applicable to capacitors composed of metallic oxide materials such as $TiO_2$, $TaON$, $HfO_2$, $Al_2O_3$, $ZrO_2$, etc.

As described above, the present invention can secure an electrical characteristic of the capacitor by preventing the lower electrode from being oxidized due to the following thermal process.

Further, since the interfacial layer between the lower electrode and the dielectric layer is formed uniformly, the leakage current characteristic is improved. Compared with the conventional $SiO_2$ layer, the interfacial layer between the lower electrode and the dielectric layer becomes a silicon nitride rich layer with a dielectric constant ( ) of about 7, so that a total capacitance is increased.

Furthermore, since an apparatus for a well-known oxide nitride oxide (ONO) process can be used without any modification, development costs required for new materials can be reduced.

While the present invention has been described with respect to certain preferred embodiments only, other modifications and variation may be made without departing from the spirit and scope of the present invention as set forth in the following claims.

What is claimed is:

1. A capacitor comprising:
   a lower electrode;
   an oxidation barrier layer formed on the lower electrode, wherein the oxidation barrier layer includes:
      a first nitridation layer formed on the lower electrode; and
      a second nitride layer formed on the first nitridation layer;
   a dielectric layer formed on the oxidation barrier layer; and
   an upper electrode formed on the dielectric layer.

2. The capacitor as recited in claim 1, wherein the oxidation barrier layer further includes:
   an oxynitride layer formed between the first nitridation layer and the second nitride layer.

3. The capacitor as recited in claim 1, wherein the lower electrode is formed of a polysilicon layer or a metal layer.

4. A semiconductor device comprising:
   a semiconductor substrate;
   an intermediate insulating layer formed on the semiconductor substrate;
   a plug connected to the semiconductor substrate through the intermediate insulating layer;
   a lower electrode formed on the plug;
   an oxidation barrier layer covering the lower electrode and the intermediate insulating layer, wherein the oxidation barrier layer includes:
      a first nitridation layer formed on the lower electrode; and
      a second nitride layer formed on the first nitridation layer;
   a dielectric layer formed on the oxidation barrier layer; and
   an upper electrode formed on the dielectric layer.

5. The semiconductor device as recited in claim 4, wherein the oxidation barrier layer further includes:
   an oxynitride layer formed between the first nitridation layer and the second nitride layer.

6. The semiconductor device as recited in claim 4, wherein the lower electrode is formed of a polysilicon layer and a metal layer.

7. A method for manufacturing a capacitor, the method comprising the steps of:
   a) forming a lower electrode;
   b) forming a first nitridation layer on the lower electrode;
   c) forming a second nitride layer on the first nitridation layer;
   d) forming a dielectric layer on the second nitride layer;
   e) performing a thermal process so as to secure a dielectric characteristic of the dielectric layer; and
   f) forming an upper electrode on the dielectric layer.

8. The method as recited in claim 7, wherein the first nitridation layer is formed by carrying out a rapid thermal nitridation process at an $NH_3$ atmosphere, a thermal process in a furnace maintaining an $NH_3$ atmosphere and a plasma process at an $NH_3$ atmosphere.

9. The method as recited in claim 8, wherein the rapid thermal nitridation process is carried out for 60 seconds to 180 seconds under the conditions that a temperature is 500° C. to 850° C, a flow rate of $NH_3$ is 1 slm to 20 slm, and a pressure is high.

10. The method as recited in claim 8, wherein the thermal process in the furnace is carried out for 30 minutes to 180 minutes under the conditions that a temperature is 500 ° J to 850 ° J and a pressure is 10 torr to 100 torr.

11. The method as recited in claim 8, wherein the plasma process is carrier out for 30 seconds to 300 seconds under the conditions that a flow rate of $NH_3$ is 10 sccm to 1000 sccm, an RF power is 50 W to 400 W and a pressure is 0.1 torr to 2 torr.

12. The method as recited in claim 7, wherein the second nitride layer is deposited using a source gas containing $NH_3$ and $SiH_2Cl_2$ or a source gas containing $NH_3$ and $SiH_4$ for 3 minutes to 60 minutes in the furnace, the furnace maintaining a temperature of 500° C. to 850° C. and a pressure of 0.05 torr to 1 torr.

13. The method as recited in claim 7, further comprising the step of forming an oxynitride layer between the first nitridation layer and the second nitride layer.

14. The method as recited in claim 13, wherein the oxynitride layer is formed by exposing the first nitridation layer to air.

15. The method as recited in claim 13, wherein a total thickness of the first nitridation layer, the oxynitride layer and the second nitride layer is 5 Å to 50 Å.

16. A semiconductor device comprising:
   a semiconductor substrate;
   an intermediate insulating layer formed on the semiconductor substrate;
   a plug connected to the semiconductor substrate through the intermediate insulating layer;
   a lower electrode formed on the plug;
   a first nitridation layer formed on the lower electrode;
   an oxynitride layer formed on the first nitridation layer;
   a second nitride layer formed on the oxynitride layer;
   a dielectric layer formed on the second nitride layer layer; and
   an upper electrode formed on the dielectric layer.

17. The semiconductor device as recited in claim 16, wherein the lower electrode is formed with a polysilicon layer.

* * * * *